(12) United States Patent
Deng et al.

(10) Patent No.: US 11,862,529 B2
(45) Date of Patent: Jan. 2, 2024

(54) CHIP AND MANUFACTURING METHOD THEREOF, AND ELECTRONIC DEVICE

(71) Applicant: HUAWEI TECHNOLOGIES CO., LTD., Guangdong (CN)

(72) Inventors: Chaojun Deng, Dongguan (CN); Xiaoyun Wei, Dongguan (CN); Yong Yang, Xi'an (CN); Jiye Xu, Dongguan (CN); Xing Fu, Kyiv (UA)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 163 days.

(21) Appl. No.: 17/473,673

(22) Filed: Sep. 13, 2021

(65) Prior Publication Data
US 2022/0102237 A1 Mar. 31, 2022

(30) Foreign Application Priority Data
Sep. 30, 2020 (CN) .......................... 202011063273.2

(51) Int. Cl.
*H01L 23/48* (2006.01)
*H01L 23/52* (2006.01)
(Continued)

(52) U.S. Cl.
CPC ...... *H01L 23/367* (2013.01); *H01L 23/49827* (2013.01); *H01L 24/08* (2013.01);
(Continued)

(58) Field of Classification Search
CPC . H01L 23/367; H01L 23/49827; H01L 24/08; H01L 2224/05611;
(Continued)

(56) References Cited

U.S. PATENT DOCUMENTS 8,436,680 B2 * 5/2013 Sugaya ................. H01L 21/563
327/565
2009/0273068 A1 11/2009 Kaskoun et al.
(Continued)

FOREIGN PATENT DOCUMENTS

CN 2499978 Y 7/2002
CN 1494136 A 5/2004
(Continued)

OTHER PUBLICATIONS

Ke Chen et al, Ultrahigh thermal conductivity in isotope-enriched cubic boron nitride, Science 367, 6477, Jan. 2020, total 18 pages.
(Continued)

*Primary Examiner* — Niki H Nguyen
(74) *Attorney, Agent, or Firm* — WOMBLE BOND DICKINSON (US) LLP

(57) ABSTRACT

Embodiments of this application provide a chip and a manufacturing method thereof, and an electronic device, and belong to the field of chip heat dissipation technologies. The chip includes a die and a thermal conductive sheet. An active surface of the die is connected to the thermal conductive sheet by using a first bonding layer. Heat generated at a part with a relatively high temperature on the active surface of the die can be quickly conducted and dispersed by using the thermal conductive sheet, so that temperatures on the active surface are evenly distributed to avoid an excessively high local temperature of the chip, thereby preventing running of the chip from being affected.

19 Claims, 7 Drawing Sheets

(51) Int. Cl.
  *H01L 29/40* (2006.01)
  *H01L 23/367* (2006.01)
  *H01L 23/498* (2006.01)
  *H01L 23/00* (2006.01)

(52) U.S. Cl.
  CPC ............... *H01L 2224/05611* (2013.01); *H01L 2224/05644* (2013.01); *H01L 2224/05647* (2013.01); *H01L 2224/05655* (2013.01); *H01L 2224/05684* (2013.01); *H01L 2224/08233* (2013.01)

(58) Field of Classification Search
  CPC . H01L 2224/05644; H01L 2224/05655; H01L 2224/05684; H01L 2224/08233
  See application file for complete search history.

(56) References Cited

U.S. PATENT DOCUMENTS

| | | | |
|---|---|---|---|
| 2012/0074585 A1* | 3/2012 | Koo | H01L 23/147 257/774 |
| 2014/0374891 A1 | 12/2014 | Low et al. | |
| 2015/0130072 A1* | 5/2015 | Wu | H01L 23/49816 438/109 |
| 2016/0064328 A1* | 3/2016 | Kwon | H01L 25/0652 438/109 |
| 2019/0074235 A1 | 3/2019 | Zou et al. | |
| 2020/0083137 A1 | 3/2020 | Park et al. | |

FOREIGN PATENT DOCUMENTS

| | | |
|---|---|---|
| CN | 100378974 C | 4/2008 |
| CN | 100390974 C | 5/2008 |
| CN | 100505248 C | 6/2009 |
| CN | 100583420 C | 1/2010 |
| CN | 102130244 A | 7/2011 |
| CN | 101556941 B | 9/2011 |
| CN | 202871787 U | 4/2013 |
| CN | 103378026 A | 10/2013 |
| CN | 103762203 A | 4/2014 |
| CN | 203774287 U | 8/2014 |
| CN | 204360313 U | 5/2015 |
| CN | 103489838 B | 4/2016 |
| CN | 205845932 U | 12/2016 |
| CN | 107523828 A | 12/2017 |
| CN | 109524373 A | 3/2019 |
| CN | 113113367 A | 7/2021 |
| EP | 0637078 A1 | 2/1995 |
| WO | 2013074122 A1 | 5/2013 |
| WO | 2018147856 A1 | 8/2018 |
| WO | 2021143429 A1 | 7/2021 |

OTHER PUBLICATIONS

Joon Sang Kang et al, Experimental observation of high thermal conductivity in boron arsenide, Science 361, 575 578(2018), Aug. 10, 2018, total 24 pages.

* cited by examiner

CHIP AND MANUFACTURING METHOD THEREOF, AND ELECTRONIC DEVICE

CROSS-REFERENCE TO RELATED APPLICATIONS

This application claims priority to Chines Patent Application No. 202011063273.2, filed on Sep. 30, 2020, which is hereby incorporated by reference in its entirety.

TECHNICAL FIELD

This application relates to the field of chip heat dissipation technologies, and in particular, to a chip and a manufacturing method thereof, and an electronic device.

BACKGROUND

With development of chip technologies, power of a chip becomes increasingly high, a growing amount of heat is generated in a running process of the chip, and a heat dissipation problem of the chip becomes increasingly prominent.

In a related technology, a passive surface of a die is connected to a heat spreader by using a thermal interface material (TIM). A heating part of the die is mainly concentrated on an active surface. Heat passes through a body of the die from the active surface, is transferred from the passive surface to the heat spreader, and is then dissipated out by using the heat spreader.

Because a material thermal conductivity of the body of the die is relatively low, and thermal contact resistance is relatively large when the passive surface is connected to the heat spreader by using the TIM, thermal resistance on the heat transfer path is relatively large, and a heat dissipation speed is relatively low. When temperatures on the active surface are uneven, it is difficult to quickly dissipate heat at a location with a relatively high temperature, affecting performance of a chip.

SUMMARY

This application provides a chip and a manufacturing method thereof, and an electronic device, to improve a heat dissipation effect of the chip. The technical solutions are as follows:

According to an embodiment, a chip is provided. The chip includes a die and a thermal conductive sheet. The die is a product form after a semiconductor component is manufactured and before the semiconductor component is packaged, such as a silicon die. The die has an active surface and a passive surface. The active surface is a surface on which an integrated circuit pattern is located, and the passive surface is a surface opposite to the active surface. The active surface of the die is connected to the thermal conductive sheet by using a first bonding layer.

The active surface is connected to the thermal conductive sheet by using the first bonding layer. Because thermal contact resistance between the die and the thermal conductive sheet is relatively small, heat at a location with a relatively high temperature on the active surface can be quickly conducted to a location with a relatively low temperature by using the connected thermal conductive sheet, so that temperatures on the active surface can be evenly distributed, and performance of the chip can be prevented from being affected by an excessively high local temperature.

A material thermal conductivity of the thermal conductive sheet is negatively correlated with thermal resistance of the thermal conductive sheet. That is, a larger material thermal conductivity of the thermal conductive sheet indicates smaller thermal resistance of the thermal conductive sheet and a better thermal conduction effect. Therefore, a larger material thermal conductivity of the thermal conductive sheet is preferred. Therefore, in an embodiment of the application, the thermal conductive sheet is made from a material with a high thermal conductivity. Herein, the material with a high thermal conductivity is a material whose thermal conductivity is greater than a specified value, for example, a material whose thermal conductivity is greater than or equal to 1000 W/m·K or a material whose thermal conductivity is greater than or equal to 1200 W/m·K.

In an embodiment, the thermal conductive sheet is made from an inorganic material with a high thermal conductivity, for example, one or more of a single crystal diamond film, a polycrystalline diamond film, a boron nitride film, and a boron arsenide film.

In some examples, there are a plurality of through holes in the thermal conductive sheet. A conductive pillar is disposed in each through hole, runs through the thermal conductive sheet, and is connected to a pad on the active surface.

For example, the conductive pillars are made from a metal material, for example, Cu, Ag, or Au.

In an embodiment, due to material characteristics, some materials of the conductive pillars easily diffuse into the thermal conductive sheet. For example, when the conductive pillars are Cu pillars, Cu has relatively strong diffusivity in Si and Si-containing materials, and Cu diffused into the thermal conductive sheet generates a trap in the thermal conductive sheet, causing device performance to degrade. Therefore, a barrier layer needs to be disposed between the conductive pillars and the thermal conductive sheet, to prevent the material of the conductive pillars from diffusing into the thermal conductive sheet.

In an embodiment, the barrier layer uses one or more of the following materials: Ti, Cr, Ni, W, and Ta.

In an embodiment, a connection strength between the conductive pillars and the thermal conductive sheet is relatively poor due to differences in materials and a method for manufacturing the conductive pillars. For example, when the thermal conductive sheet is a single crystal diamond film or a polycrystalline diamond film, the conductive pillars are copper pillars, and the conductive pillars are formed through electroplating, the connection strength between the conductive pillars and the thermal conductive sheet is relatively poor. In this case, the chip further includes: a seed layer located between the conductive pillars and the thermal conductive sheet, to enhance the connection strength between the conductive pillars and the thermal conductive sheet.

In an embodiment, the conductive pillars are formed in the thermal conductive sheet through sintering. In this case, there is no need to dispose a seed layer between the conductive pillars and the thermal conductive sheet.

When the conductive pillars exist in the thermal conductive sheet, the first bonding layer needs to complete at least bonding of an insulating material. That is, the first bonding layer includes an insulated connection layer, a region of the active surface other than the pads is connected to the thermal conductive sheet through bonding by using the insulated connection layer, and the pads of the active surface are connected to the conductive pillars that extend into the insulated connection layer.

In an embodiment, the first bonding layer is a hybrid bonding layer, and the hybrid bonding layer needs to complete bonding of an insulating material and also needs to complete bonding of a conductive material. Therefore, the first bonding layer includes the insulated connection layer and electrical interconnection structures located in the insulated connection layer. The pads of the active surface are connected to the conductive pillars through bonding by using the electrical interconnection structures, and the region of the active surface other than the pads is connected to the thermal conductive sheet through bonding by using the insulated connection layer.

In an embodiment, the first bonding layer completes only bonding of an insulating material. In this case, the first bonding layer includes only the insulated connection layer, the conductive pillars are deposited on the pads of the active surface, and the region of the active surface other than the pads is connected to the thermal conductive sheet through bonding by using the insulated connection layer.

In an embodiment, the insulated connection layer is made from a compound material or a polymeric material. The compound material includes but is not limited to $SiO_2$, AlN, and SiC. The polymeric material includes but is not limited to benzocyclobutene (BCB), near ultraviolet negative photoresist (SU-8), and polyimide (PI).

In an embodiment, the electrical interconnection structures are made from one or more of the following materials: Cu, W, Ni, CuSn, and AuSn.

To further increase a temperature conduction speed of the active surface and improve heat dissipation performance of the chip, a proper material needs to be selected to make thermal resistance of the first bonding layer relatively small, for example, less than a specified value. For example, the specified value is 1 $Kmm^2/W$.

In an embodiment, the chip is a chip that uses a three-dimensional stacking technology, and the chip includes at least two dies and at least one thermal conductive sheet. The at least two dies are sequentially stacked, and the thermal conductive sheet is disposed on the active surfaces of at least some of the dies.

In an embodiment, to help improve heat dissipation performance, the active surface of each die is connected to one thermal conductive sheet. That is, the dies and the thermal conductive sheets are stacked alternately, and in a stacked structure, the dies are located on one side of an arrangement direction of the dies, and the thermal conductive sheets are located on the other side of the arrangement direction of the dies. Alternatively, in some other examples, one thermal conductive sheet is disposed between every two adjacent dies. That is, the dies and the thermal conductive sheet are stacked alternately, and in a stacked structure, the dies are located on both sides of an arrangement direction of the dies.

In an embodiment, the thermal conductive sheet is connected to a passive surface of the adjacent die by using a second bonding layer, and a structure of the second bonding layer is the same as that of the first bonding layer. The two adjacent dies are electrically connected to each other by using the conductive pillars in the corresponding thermal conductive sheet.

In addition to the three-dimensional stacked chip, this application is also applicable to a chip including one die and one thermal conductive sheet.

In an embodiment, the chip further includes a circuit board, and the die and the thermal conductive sheet are located on the circuit board. For example, the circuit board is a substrate, or the circuit board includes a substrate and an interposer located on the substrate.

In an embodiment, in an arrangement direction of the die and the thermal conductive sheet, the thermal conductive sheet is adjacent to the circuit board. In this case, the die is connected to the circuit board in a fanout manner, or is connected to the circuit board by using the conductive pillars in the thermal conductive sheet.

In an embodiment, in an arrangement direction of the die and the thermal conductive sheet, the die is adjacent to the circuit board, and the pads of the active surface of the die are connected to the circuit board by using solderballs.

In an embodiment, a thickness of the die is 15 μm to 500 μm. Currently, thicknesses of most dies are 775 μm, and when the thickness of the die is reduced to 15 μm to 500 μm, heat conduction in a vertical direction of the three-dimensional stacked chip is facilitated.

In an embodiment, a thickness of the thermal conductive sheet is 50 μm to 400 μm. When the thickness of the die is reduced, a value of the thickness of the thermal conductive sheet is selected within this range. This is equivalent to replacing a material of a die with a low thermal conductivity with a thermal conductive sheet with a high thermal conductivity, to reduce thermal resistance in the vertical direction of the three-dimensional chip on a premise that the thickness of the chip remains basically unchanged.

In an embodiment, the chip further includes a heat spreader, where the heat spreader is connected to the passive surface of the outermost die.

For example, the heat spreader includes but is not limited to a radiating fin, a heat sink, and a vapor chamber. The radiating fin is made from an inorganic material with a high thermal conductivity, for example, one or more of a single crystal diamond film, a polycrystalline diamond film, a boron nitride film, and a boron arsenide film.

In an embodiment, the heat spreader is connected to the outermost die by using a third bonding layer or a thermal interface material.

In some examples, when the heat spreader is a radiating fin, the radiating fin is connected to the passive surface of the outermost die by using the third bonding layer.

For example, the third bonding layer is made from a metal material, and the metal material includes one or more of the following: Au, AuSn, Cu, CuSn, Ag, and AgSn; or the third bonding layer is made from a nonmetallic material, and the nonmetallic material includes one or more of the following: $SiO_2$, SiC, AlN, and Si.

Because a larger contact area indicates higher thermal conduction efficiency, to ensure a heat dissipation effect, a size of the thermal conductive sheet is greater than or equal to that of the die. In this way, after the thermal conductive sheet is connected to the active surface of the die, a projection of the die on a surface of the connected thermal conductive sheet is located within the surface or overlaps the surface.

According to an embodiment, a chip manufacturing method is provided for manufacturing any one of the foregoing chips. The manufacturing method includes: providing a die; and forming a first bonding layer between an active surface of the die and the thermal conductive sheet, to connect the active surface of the die to the thermal conductive sheet by using the first bonding layer.

In an embodiment, conductive pillars that run through the thermal conductive sheet are first formed in the thermal conductive sheet, and then the active surface of the die is connected to the thermal conductive sheet through bonding. In an embodiment, the forming a first bonding layer between an active surface of the die and the thermal conductive sheet includes: providing the thermal conductive sheet run through by conductive pillars; forming an insulated first connection sublayer in a region of the active surface other than pads; forming an insulated second connection sublayer in a region of a side surface of the thermal conductive sheet other than the conductive pillars; and connecting the first connection sublayer to the second connection sublayer through bonding, and connecting the pads of the active surface to the conductive pillars through bonding, to form the first bonding layer.

In an embodiment, the thermal conductive sheet is first connected to the active surface of the die through bonding, and then the conductive pillars are formed in the thermal conductive sheet.

For example, in some examples, the forming a first bonding layer between an active surface of the die and the thermal conductive sheet includes: first forming an insulated first connection sublayer on the active surface; forming an insulated second connection sublayer on a side surface of the thermal conductive sheet; then, connecting the first connection sublayer to the second connection sublayer through bonding, to form an insulated connection layer; forming, in the thermal conductive sheet and the insulated connection layer, through holes corresponding to pads on the active surface, where a part in the insulated connection layer other than the through holes is the first bonding layer; and forming, through deposition on the pads, conductive pillars located in the through holes, where the conductive pillars run through the thermal conductive sheet.

In some examples, the forming a first bonding layer between an active surface of the die and the thermal conductive sheet includes: forming an insulated first connection sublayer in a region of the active surface other than pads; forming a plurality of through holes in the thermal conductive sheet, where the through holes correspond to the pads; forming an insulated second connection sublayer in a region of a side surface of the thermal conductive sheet other than the through holes; connecting the first connection sublayer to the second connection sublayer through bonding, to form the first bonding layer, and then forming, through deposition on the pads, conductive pillars located in the through holes, where the conductive pillars run through the thermal conductive sheet.

In an embodiment, for a three-dimensional stacked chip, the manufacturing method further includes: connecting a passive surface of the die to another thermal conductive sheet by using a second bonding layer, where a structure of the second bonding layer is the same as that of the first bonding layer.

In an embodiment, the manufacturing method further includes: connecting, to a circuit board, the die and the thermal conductive sheet that are connected together.

In an embodiment, the manufacturing method further includes: connecting, to a heat spreader, the passive surface of the outermost die in the die and the thermal conductive sheet that are connected together.

For example, if the heat spreader is the foregoing radiating fin, the passive surface of the outermost die is connected to the radiating fin by using a third bonding layer.

According to an embodiment, an electronic device is provided, including any one of the foregoing chips.

DESCRIPTION OF REFERENCE SIGNS

10: die; 10a: Cu pillar; 11: active surface; 11a: pad; 12: passive surface; 12a: opening;
20: thermal conductive sheet; 21: conductive pillar; 20a: through hole;
30: first bonding layer; 31: insulated connection layer; 31a: first connection sublayer; 31b: second connection sublayer; 32: electrical interconnection structure;
40: second bonding layer; 41: insulated connection layer; 42: electrical interconnection structure;
50: circuit board; 51: substrate; 51a: solderball; 51b: solderball; 52: interposer; 52a: solderball;
60: radiating fin; and
70: third bonding layer.

DESCRIPTION OF EMBODIMENTS

An embodiment of this application provides a chip. In some examples, the chip is a processor chip, a memory chip, or the like.

Figure 1:
FIG. 1 is a schematic structural diagram of a chip according to an embodiment of this application.

FIG. 1 is a schematic structural diagram of a chip according to an embodiment of this application. As shown in FIG. 1, the chip includes a die 10 and a thermal conductive sheet 20. The die 10 has an active surface 11 and a passive surface 12. The active surface 11 is a surface on which an integrated circuit pattern is located, and the passive surface 12 is a surface opposite to the active surface 11. The active surface 11 of the die 10 is connected to the thermal conductive sheet 20 by using a first bonding layer 30.

In an embodiment of the application, the die 10 is a product form after a semiconductor component is manufactured and before the semiconductor component is packaged, such as a silicon die.

The active surface is connected to the thermal conductive sheet by using the first bonding layer. In a bonding connection manner, because thermal contact resistance between the die and the thermal conductive sheet is very small, and is less than 0.5 Kmm²/W, heat at a location with a relatively high temperature on the active surface can be quickly conducted to a location with a relatively low temperature by using the connected thermal conductive sheet, so that temperatures on the active surface can be evenly distributed, and performance of the chip can be prevented from being affected by an excessively high local temperature.

A material thermal conductivity of the thermal conductive sheet is negatively correlated with thermal resistance of the thermal conductive sheet. That is, a larger material thermal conductivity of the thermal conductive sheet indicates smaller thermal resistance of the thermal conductive sheet and a better thermal conduction effect. Therefore, a larger material thermal conductivity of the thermal conductive sheet is preferred. Therefore, in an embodiment of the application, the thermal conductive sheet is made from a material with a high thermal conductivity. Herein, the material with a high thermal conductivity is a material whose thermal conductivity is greater than a specified value, for example, a material whose thermal conductivity is greater than or equal to 1000 W/m·K or a material whose thermal conductivity is greater than or equal to 1200 W/m·K.

In some examples, the thermal conductive sheet 20 is made from an inorganic material with a high thermal conductivity. For example, the thermal conductive sheet 20 is made from one or more of a single crystal diamond film, a polycrystalline diamond film, a boron nitride film, and a boron arsenide film. The thermal conductive sheet 20 made from these materials not only has a high thermal conductivity, but also has strong chemical bond energy and stable chemical performance, and is not prone to causing corrosion and being corroded. Moreover, compared with a thermal conductive sheet made from a metal material, a thermal expansion coefficient of the thermal conductive sheet made from a nonmetallic material better matches that of a die made from a semiconductor material, and an insulating property of the thermal conductive sheet made from the nonmetallic material is excellent. No interference is caused by the material of the thermal conductive sheet to electrical signals. Performance is not affected in environments such as high temperature and high radiation environments.

In the embodiment shown in FIG. 1, the thermal conductive sheet 20 is a monolithic structure, and the first bonding layer 30 is formed by using an insulating material. In an embodiment, the die 10 needs to be electrically connected to another electronic component in a fanout manner, to implement electrical signal transmission.

In some examples, pads are disposed on the active surface 11 of the die 10. For example, the pads are located on an edge of the active surface, the integrated circuit pattern is located at a central part of the active surface, and the pads are electrically connected to the integrated circuit pattern. The first bonding layer 30 avoids the pads, and is connected between only the central part of the active surface of the die and the thermal conductive sheet. The pads are connected to the another electronic component by using a metal lead. The another electronic component includes but is not limited to another die and a substrate. This manner of connection to another electronic component by using an external metal lead is the fanout manner.

Figure 2:
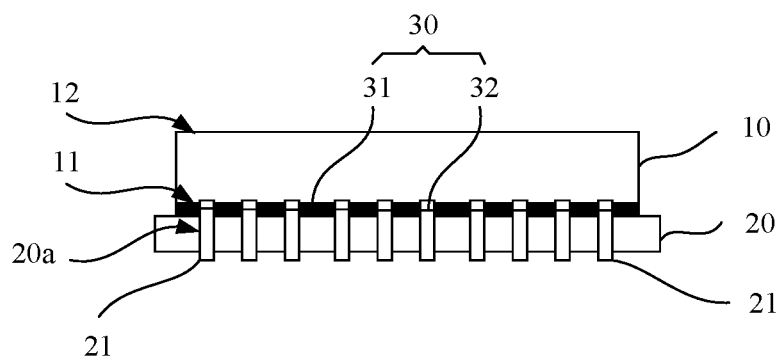
FIG. 2 is a schematic structural diagram of a chip according to an embodiment of this application.

FIG. 2 is a schematic structural diagram of a chip according to an embodiment of this application. As shown in FIG. 2, the chip includes a die 10 and a thermal conductive sheet 20. The die 10 has an active surface 11 and a passive surface 12. The active surface 11 is a surface on which an integrated circuit pattern is located, and the passive surface 12 is a surface opposite to the active surface. The active surface 11 of the die 10 is connected to the thermal conductive sheet 20 by using a first bonding layer 30.

Figure 3:
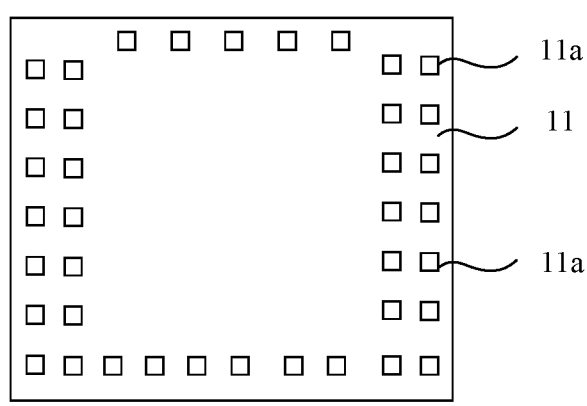
FIG. 3 is a schematic structural diagram of an active surface of a die according to an embodiment of this application.

FIG. 3 is a schematic structural diagram of an active surface of a die according to an embodiment of this application. As shown in FIG. 3, there are a plurality of pads 11a on the active surface 11. The pad 11a is configured to electrically connect to another electronic component, to perform electrical signal transmission. It should be noted that, locations of the pads in FIG. 3 are merely examples, and are not used as a limitation on this application. For example, the pads 11a not only are located on an edge of the active surface 11, but also are located at a central part of the active surface 11.

In an embodiment of the application, the pads are usually made from a metal material. In some examples, the pads 11a are made from a bonding metal material, for example, Cu, Ag, Au, or Al, or are made from a solder with a low melting point, for example, AgSn, AgCuSn, or CuSn. In an embodiment, the pads have a single-layer structure or a multi-layer structure.

In some examples, the pads 11a protrude at least partially from the active surface 11, to facilitate subsequent connection to conductive pillars 21 in the thermal conductive sheet 20.

Refer to FIG. 2 again. A plurality of through holes 20a are provided in the thermal conductive sheet 20, and one conductive pillar 21 is disposed in each through hole 20a. The conductive pillars 21 run through the thermal conductive sheet 20 and protrude from a surface of the thermal conductive sheet 20.

For example, the conductive pillars 21 are made from a metal material, for example, Cu, Ag, or Au.

In some examples, due to material characteristics, some materials of the conductive pillars easily diffuse into the thermal conductive sheet, affecting device performance. Therefore, a barrier layer needs to be disposed between the conductive pillars and the thermal conductive sheet. For example, when the conductive pillars are Cu pillars, Cu has a relatively high diffusion coefficient. To prevent Cu from diffusing into the thermal conductive sheet, a barrier layer needs to be disposed between the conductive pillars and the thermal conductive sheet.

In an embodiment, the barrier layer uses one or more of the following materials: Ti, Cr, Ni, W, and Ta.

In some examples, a connection strength between the conductive pillars and the thermal conductive sheet is relatively poor due to differences in materials and a method for manufacturing the conductive pillars. For example, when the thermal conductive sheet is a single crystal diamond film or a polycrystalline diamond film, the conductive pillars are copper pillars, and the conductive pillars are formed through electroplating, the connection strength between the conductive pillars and the thermal conductive sheet is relatively poor. In this case, the chip further includes: a seed layer located between the conductive pillars and the thermal conductive sheet, to enhance the connection strength between the conductive pillars and the thermal conductive sheet. In an embodiment, the seed layer and the barrier layer are a same layer, for example, a Ti layer, or the seed layer and the barrier layer are different layers, for example, the seed layer is a Ti layer, and the barrier layer is a Ni layer.

In some examples, the conductive pillars are formed in the thermal conductive sheet through sintering. In this case, there is no need to dispose a seed layer between the conductive pillars and the thermal conductive sheet.

In some examples, the barrier layer may be first formed on inner walls of the through holes of the thermal conductive sheet 20 in a manner such as sputtering, and then the conductive pillars are formed through electroplating.

Figure 4:
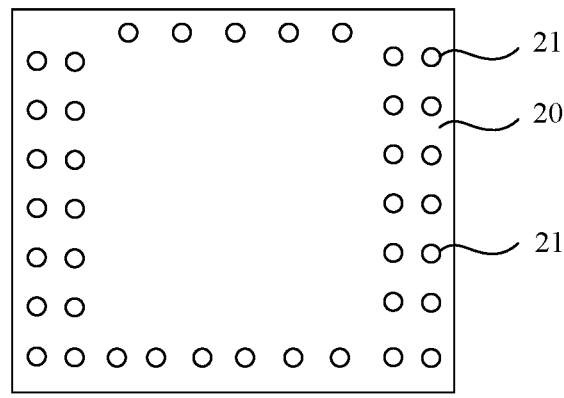
FIG. 4 is a schematic structural top view of a thermal conductive sheet according to an embodiment of this application.

FIG. 4 is a schematic structural top view of a thermal conductive sheet according to an embodiment of this application. As shown in FIG. 4, the plurality of conductive pillars 21 are disposed in the thermal conductive sheet 20. In some examples, a diameter of the conductive pillars 21 is 3 μm to 50 μm. A diameter size of the conductive pillars matches a pad size of most chips. In practical application, adjustment may be made based on an actual situation.

In an embodiment of the application, locations of the conductive pillars 21 in the thermal conductive sheet 20 are determined based on locations of the pads 11a on the active surface 11 of the die 10.

The plurality of conductive pillars 21 correspond to the plurality of pads 11a one to one, and are electrically connected to the corresponding pads 11a. When the die 10 is connected to the thermal conductive sheet 20, the pads 11a on the die 10 first need to be aligned with the conductive pillars 21 in the thermal conductive sheet 20, and alignment precision needs to fall within a required value, for example, within ±2 μm. In some examples, the alignment precision is represented by a distance between a center of the pad and a center of the conductive pillar.

In some examples, because the active surface is connected to the thermal conductive sheet by using a first bonding layer, to electrically connect the pads on the active surface to the corresponding conductive pillars, the first bonding layer needs to be a hybrid bonding layer. The hybrid bonding layer needs to complete bonding of an insulating material and also needs to complete bonding of a conductive material. As shown in FIG. 2, the first bonding layer 30 includes an insulated connection layer 31 and electrical interconnection structures 32 located in the insulated connection layer 31. The pads 11a of the active surface 11 are connected to the conductive pillars 21 in the thermal conductive sheet 20 through bonding by using the electrical interconnection structures 32, and a region of the active surface 11 other than the pads 11a is connected to the thermal conductive sheet 20 through bonding by using the insulated connection layer 31. The insulated connection layer 31 is filled between the plurality of electrical interconnection structures 32.

In some examples, the insulated connection layer 31 is made from a compound material or a polymeric material. The compound material includes but is not limited to SiO2, AlN, and SiC. The polymeric material includes but is not limited to BCB, SU-8, and PI.

In some examples, the electrical interconnection structures 32 are made from one or more of the following materials: Cu, Ni, W, CuSn, and AuSn. For example, the electrical interconnection structures 32 is of a single-layer structure, for example, a Cu layer, a CuSn layer, or an AuSn layer; or one of the electrical interconnection structures 32 is of a multi-layer structure, for example, one of the electrical interconnection structures 32 includes a Cu layer and a CuSn layer.

Figure 5:
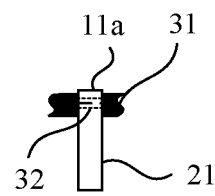
FIG. 5 is a schematic diagram of a state of connection between a pad and a conductive pillar according to an embodiment of this application.

FIG. 5 is a schematic diagram of a state of connection between a conductive pillar and a pad according to an embodiment of this application. A dashed line in FIG. 5 represents a bonding interface between the pad 11a and the conductive pillar 21. The electrical interconnection structure 32 is a part within a particular thickness range with the bonding interface as a center in an extension direction of the conductive pillar 21, for example, a part shown by a dotted line box in FIG. 5. Within this thickness range, the pad 11a and the conductive pillar 21 are combined with each other. For example, atoms of the pad 11a and the conductive pillar 21 infiltrate into each other and are combined with each other.

In some examples, the pads 11a and the conductive pillars 21 are made from a same material, for example, Cu, and then the electrical interconnection structures 32 each are a part in which Cu atoms infiltrate into each other. In some other examples, parts opposite to each other of the pads 11a and the conductive pillars 21 respectively are made from different materials. For example, surfaces of the pads each are a Sn layer, the conductive pillars 21 are made from Cu, and the electrical interconnection structures 32 each are a part in which Sn atoms of the pads are combined with Cu atoms of the conductive pillars to form a CuSn alloy. In another example, the surfaces of the pads each are a CuSn layer, the conductive pillars 21 are made from Cu, and the electrical interconnection structures 32 each are a part in which the CuSn layer is combined with Cu.

Alternatively, in another embodiment, the first bonding layer 30 includes only an insulated connection layer 31. The conductive pillars 21 are deposited on the pads 11a so as to connect to the pads 11a. For example, the conductive pillars 21 are deposited on the pads 11a through electroplating.

To further increase a temperature conduction speed of the active surface and improve heat dissipation performance of the chip, a proper material needs to be selected to make thermal resistance of the first bonding layer 30 relatively small, for example, less than a specified value. For example, the specified value is 1 Kmm$^2$/W.

For example, a thickness of the first bonding layer 30 is less than 10 μm. Thermal resistance is positively correlated with a thickness of a material. That is, a thicker material indicates larger thermal resistance. Therefore, the thickness of the first bonding layer 30 is set to be relatively small, to avoid excessively large thermal resistance of the first bonding layer, thereby preventing heat dissipation performance of the chip from being affected.

A three-dimensional (3D) stacking technology is an important development trend in the field of chips. A three-dimensional stacked chip means that at least two interconnected dies are stacked and then packaged.

In some examples, a plurality of dies stacked together are electrically connected by using a vertical interconnection structure. The vertical interconnection structure uses a through silicon via (TSV) based Cu interconnection technology. In the interconnection technology, through holes are provided in a die. The through holes extend from an active surface of the die to a passive surface, Cu pillars are disposed in the through holes, and the die is electrically connected to another die located on the passive surface of the die by using the Cu pillars. In an embodiment, the vertical interconnection structure can increase a chip integration level; and in an embodiment, the vertical interconnection structure can shorten a delay of inter-chip interconnection based on an advantage of short-range interconnection.

For the three-dimensional stacked chip, a heat generation problem inside the chip is more serious. Therefore, in an embodiment of the application, thermal conductive sheets may be disposed on active surfaces of at least some dies in the three-dimensional stacked chip. For example, the thermal conductive sheet is disposed on the active surface of at least one die below (namely, a location close to a substrate), or the thermal conductive sheet is disposed on the active surface of at least one die in the middle or above (namely, a location away from the substrate), or the thermal conductive sheet is disposed on the active surface of each die except a lowest die, or the thermal conductive sheet is disposed on the active surface of each die.

Figure 6:
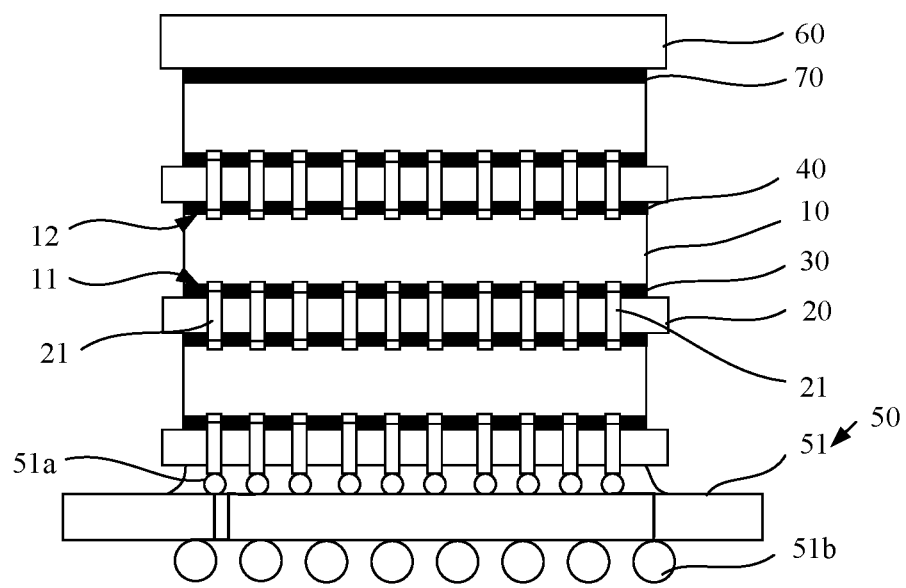
FIG. 6 is a schematic structural diagram of a chip according to an embodiment of this application.

FIG. 6 is a schematic structural diagram of a chip according to an embodiment of this application. As shown in FIG. 6, the chip includes a plurality of dies 10 and a plurality of thermal conductive sheets 20. The dies 10 and the thermal conductive sheets 20 are stacked alternately. A quantity of the dies 10 is equal to that of the thermal conductive sheets 20. An active surface 11 of each die 10 is connected to one thermal conductive sheet 20 by using a first bonding layer 30.

For example, the die 10 uses the foregoing TSV based Cu interconnection technology.

Figure 7:
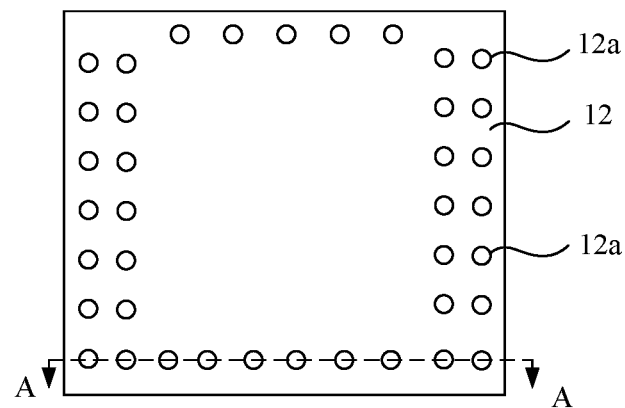
FIG. 7 is a schematic structural diagram of a passive surface of a die according to an embodiment of this application.

FIG. 7 is a schematic structural diagram of a passive surface of a die according to an embodiment of this application. As shown in FIG. 7, there are a plurality of openings 12a in the passive surface 12 of the die 10. Each opening 12a corresponds to one through hole. Refer to FIG. 3 for a structure of the active surface of the die 10 in FIG. 5. With reference to FIG. 3 and FIG. 6, the openings 12a of the passive surface 12 correspond to pads 11a on the active surface 11 one to one.

Figure 8:
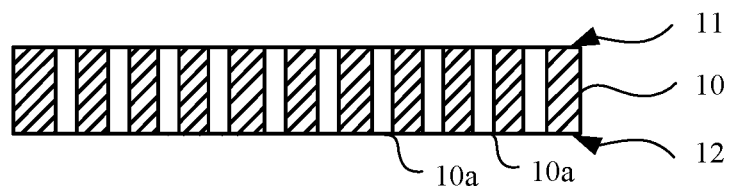
FIG. 8 is a schematic structural diagram of a cross section along a line A-A in FIG. 7.

FIG. 8 is a schematic structural diagram of a cross section along a line A-A in FIG. 7. As shown in FIG. 8, a plurality of through holes are provided in the die 10. Each of the through holes extends from the active surface 11 of the die 10 to the passive surface 12. A Cu pillar 10a is disposed in the through hole. One end of the Cu pillar 10a is connected to a pad 11a of the active surface 11. The other end of the Cu pillar 10a is exposed from an opening 12a on the passive surface 12 through the through hole.

Each thermal conductive sheet 20 is connected to the passive surface 12 of the adjacent die 10 by using a second bonding layer 40. In this way, two adjacent dies and the second bonding layer between the two dies form an entirety, to reduce thermal resistance on a heat conduction path in a vertical direction (namely, a stacking direction), thereby improving heat dissipation performance of the chip.

In some examples, the second bonding layer 40 also needs to implement bonding of an insulating material and bonding of a conductive material at the same time. Therefore, a structure of the second bonding layer 40 is the same as that of the first bonding layer 30. Refer to FIG. 6 again. The second bonding layer 40 includes an insulated connection layer 41 and electrical interconnection structures 42 located in the insulated connection layer 41. A conductive pillar 21 in the thermal conductive sheet 20 is connected to one end of the Cu pillar in the die 10 through bonding by using the electrical interconnection structure 42. The thermal conductive sheet 20 is connected, through bonding, to a region other than Cu pillars on the passive surface 12 of the die 10 adjacent to the thermal conductive sheet 20 by using the insulated connection layer 41. Electrical signal interconnection between the two adjacent dies 10 may be implemented by using the electrical interconnection structures 32 of the first bonding layer 30, the conductive pillars 21, and the electrical interconnection structures 42 of the second bonding layer 40. Moreover, the thermal conductive sheet 20 between the two adjacent dies 10 can quickly spread and dissipate heat in a stacking region, thereby reducing a junction temperature.

In an embodiment, referring to FIG. 6 again, the chip further includes a circuit board 50, the dies 10 and the thermal conductive sheets 20 are located on the circuit board 50, and in an arrangement direction of the dies 10 and the thermal conductive sheets 20, the thermal conductive sheet 20 is adjacent to the circuit board 50. The conductive pillars 21 in the outermost thermal conductive sheet 20 are connected to the circuit board 50. Namely, the conductive pillars 21 in the lowest thermal conductive sheet 20 in the figure are connected to the circuit board 50. The circuit board 50 includes a substrate 51. The conductive pillars 21 in the thermal conductive sheet 20 are connected to pads on a surface of the substrate 51, for example, by using solderballs 51a. The substrate 51 is a chip package substrate, including but not limited to a printed circuit board or a ceramic substrate. For example, the other surface of the substrate 51 is connected to an external circuit by using solderballs 51b.

For a three-dimensional stacked chip, usually, a large amount of heat accumulates on the lowest die. When a thermal conductive sheet 20 is disposed between the substrate 50 and the lowest die 10, quick temperature equalization of the lowest chip can be implemented.

In an embodiment, as shown in FIG. 6, the chip further includes a radiating fin 60. The radiating fin 60 is connected to the passive surface 12 of the outermost die 10, namely, the passive surface 12 of the uppermost die 10, by using a third bonding layer 70.

In some examples, the third bonding layer 70 is made from a metal material. In an embodiment, the third bonding layer 70 has a single-layer structure, for example, is made from at least one of the following materials: Au, AuSn, Cu, CuSn, Ag, and AgSn. Alternatively, the third bonding layer 70 has a multi-layer structure. For example, the third bonding layer includes an interlayer and a bonding layer. The interlayer and the bonding layer are sequentially located on the passive surface of the die. For example, the interlayer is made from one or more of the following materials: Ti, Cr, W, and Ni. The bonding layer is made from one or more of the following: Au, AuSn, Cu, CuSn, Ag, and AgSn.

In some other examples, the third bonding layer 70 is made from a nonmetallic material, and the nonmetallic material includes one or more of the following: SiO2, SiC, AlN, and Si.

To further increase a temperature conduction speed of the active surface and improve heat dissipation performance of the chip, a proper material needs to be selected to make thermal resistance of the third bonding layer relatively small, for example, less than a specified value. For example, the specified value is 1 Kmm$^2$/W.

In some examples, a thickness of the third bonding layer 70 is 0.5 μm to 10 μm.

The radiating fin 60 may be made from a material with a high thermal conductivity. Herein, the material with a high thermal conductivity is a material whose thermal conductivity is greater than a specified value, for example, a material whose thermal conductivity is greater than or equal to 1000 W/m·K or a material whose thermal conductivity is greater than or equal to 1200 W/m·K.

In some examples, the radiating fin 60 is made from an inorganic material with a high thermal conductivity, for example, one or more of a single crystal diamond film, a polycrystalline diamond film, a boron nitride film, and a boron arsenide film.

In some examples, to meet a heat dissipation requirement, a thickness of the radiating fin 60 is greater than or equal to 300 μm, for example, 300 μm to 2000 μm.

In some examples, the radiating fin 60 is manufactured in any one of the following manners: high temperature high pressure (HTHP), microwave plasma assisted chemical vapor deposition (MWCVD), direct current arc plasma jet chemical vapor deposition (DC arc CVD), and physical vapor deposition (PVD).

In some examples, manners of bonding between the radiating fin 60 and the passive surface 12 of the die 10 include but are not limited to eutectic bonding, atomic diffusion bonding (ADB), thermal compression bonding, and surface activated bonding (SAB).

It should be noted that, in another embodiment, the radiating fin 60 may be replaced with a heat spreader in another form, for example, a heat sink or a vapor chamber. For example, the heat sink is made from a material such as Cu or Al.

In an embodiment, a thickness of the die is 15 µm to 500 µm. Currently, thicknesses of most dies are 775 µm. Because a thermal conductivity of a material (for example, Si) of the die is relatively small, the thickness of the die is reduced to 15 µm to 500 µm, to reduce thermal resistance in a vertical direction of the three-dimensional stacked chip, thereby facilitating heat conduction in the vertical direction of the three-dimensional stacked chip.

In some examples, a thickness of the thermal conductive sheet 20 is 50 µm to 500 µm. When the thickness of the die is reduced, a value of the thickness of the thermal conductive sheet is selected within this range. This is equivalent to replacing a material of a die with a low thermal conductivity with a thermal conductive sheet with a high thermal conductivity, to reduce thermal resistance in the vertical direction of the three-dimensional chip on a premise that the thickness of the chip remains basically unchanged.

In the three-dimensional stacked chip in FIG. 6, when polycrystalline diamond films with a thermal conductivity of 1200 W/m·K are used as the thermal conductive sheet and the radiating fin, a heat dissipation benefit of the chip is increased by 11% compared with a three-dimensional stacked chip in which no thermal conductive sheet or radiating fin is used. An on-chip temperature difference and a highest junction temperature of the chip can both have a heat dissipation benefit of greater than or equal to 10° C., thereby effectively reducing heat dissipation load of a system.

To ensure a heat dissipation effect, a size of the thermal conductive sheet 20 is greater than or equal to that of the die 10. In this way, after the thermal conductive sheet is connected to the active surface of the die, a projection of the die 10 on a surface of the connected thermal conductive sheet 20 overlaps the surface. That is, an outer edge of the die 10 is aligned with that of the thermal conductive sheet 20. Alternatively, the projection of the die 10 on the surface of the connected thermal conductive sheet 20 is located within the surface. That is, the outer edge of the thermal conductive sheet 20 exceeds that of the die 10.

Figure 9:
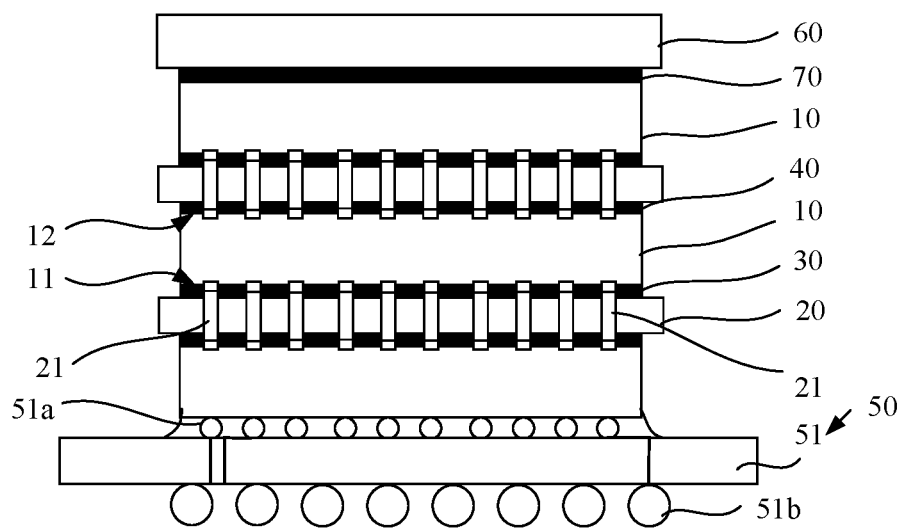
FIG. 9 is a schematic structural diagram of a chip according to an embodiment of this application.

FIG. 9 is a schematic structural diagram of a chip according to an embodiment of this application. As shown in FIG. 9, the chip includes a plurality of dies 10 and a plurality of thermal conductive sheets 20. The dies 10 and the thermal conductive sheets 20 are stacked alternately. The structure shown in FIG. 9 differs from the structure shown in FIG. 6 in that, in the structure shown in FIG. 9, a quantity of the dies 10 is one less than that of the thermal conductive sheets 20. An active surface 11 of the outermost die 10 is not connected to the thermal conductive sheet 20, but is directly connected to a substrate 51 by using solderballs 51a.

In some examples, the three-dimensional stacked chips in FIG. 6 and FIG. 9 are memory chips, for example, high-bandwidth memory (HBM) chips.

It should be noted that, in the foregoing three-dimensional stacked chips, the plurality of thermal conductive sheets 20 are made from a same material. For example, the plurality of thermal conductive sheets 20 are all made from polycrystalline diamond films. Alternatively, the plurality of thermal conductive sheets 20 are made from different materials, for example, some thermal conductive sheets 20 are made from polycrystalline diamond films and some thermal conductive sheets 20 are made from boron nitride films.

Figure 10:
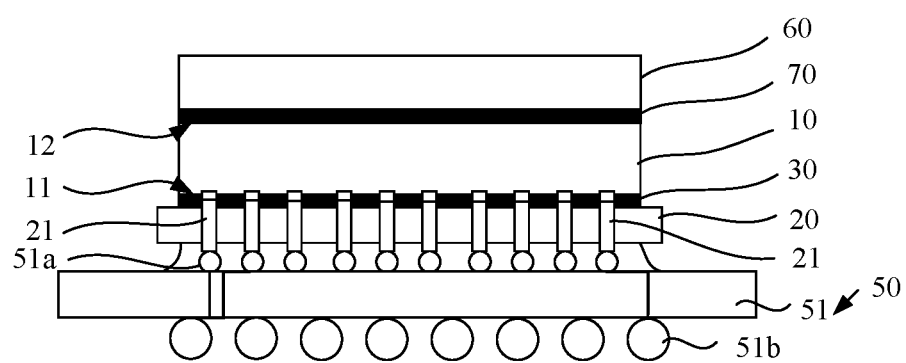
FIG. 10 is a schematic structural diagram of a chip according to an embodiment of this application.

FIG. 10 is a schematic structural diagram of a chip according to an embodiment of this application. As shown in FIG. 10, a structure of the chip differs from the structure of the chip shown in FIG. 9 in that, the chip shown in FIG. 10 includes only one die 10 and one thermal conductive sheet 20. An active surface 11 of the die 10 is connected to the thermal conductive sheet 20 by using a first bonding layer 30, and conductive pillars 21 in the thermal conductive sheet 20 are connected to a substrate 51 by using solderballs 51a. A passive surface 12 of the die 10 is connected to a radiating fin 60 by using a third bonding layer 70.

For a chip power consumption density of 150 W/cm$^2$, when polycrystalline diamond films with a thermal conductivity of 1200 W/m·K are used as the thermal conductive sheet and the radiating fin, a heat dissipation benefit of the chip is increased by 7%, and a junction temperature of the chip is decreased by greater than or equal to 7° C. compared with a chip in which no thermal conductive sheet or radiating fin is used, thereby effectively reducing heat dissipation load of a system.

Figure 11:
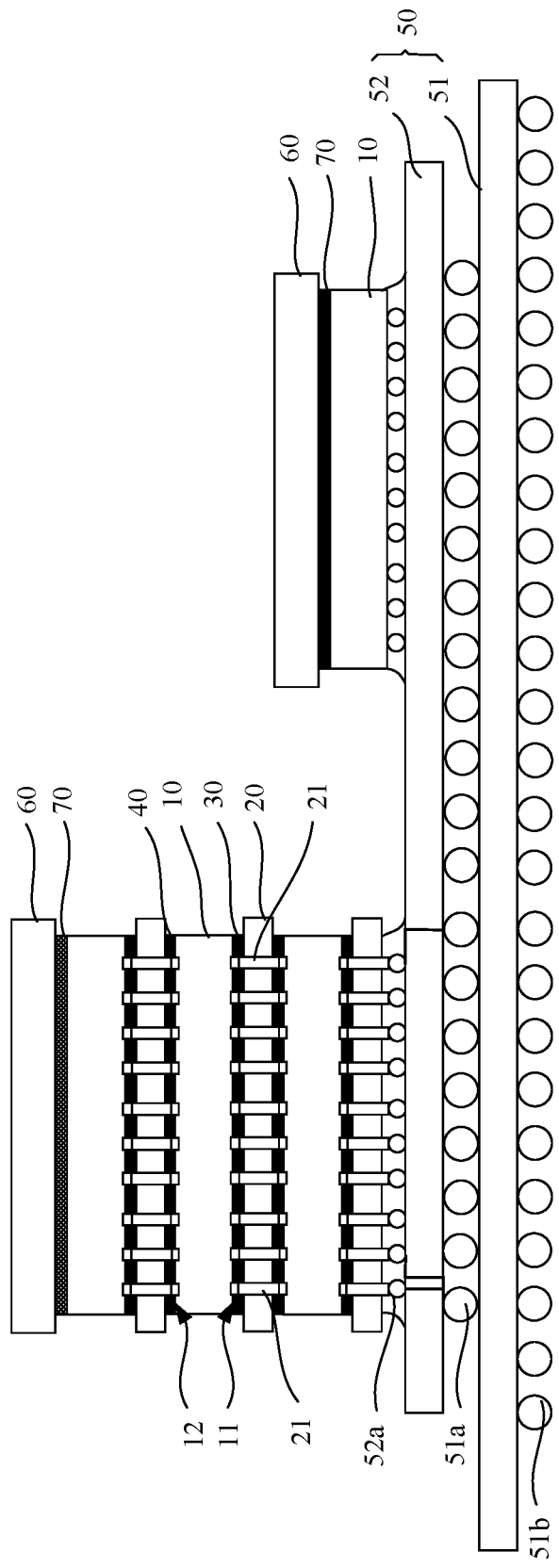
FIG. 11 is a schematic structural diagram of a chip according to an embodiment of this application.

FIG. 11 is a schematic structural diagram of a chip according to an embodiment of this application. As shown in FIG. 11, the structure of the chip differs from the structure of chip shown in FIG. 6 in that, in addition to a substrate 51, a circuit board 50 further includes an interposer 52. The substrate 51 is not directly connected to a die 10 and a thermal conductive sheet 20 that are stacked together, but is connected, by using the interposer 52, to the die 10 and the thermal conductive sheet 20 that are stacked together.

For example, as shown in FIG. 11, a side surface of the interposer 52 is connected to conductive pillars 21 in the thermal conductive sheet 20 by using solderballs 52a, and the other side surface of the interposer 52 is connected to the substrate 51 by using solderballs 51a.

Assuming that a group of dies includes one die or at least two dies that are stacked together, the chip in FIG. 11 includes two groups of dies. The two groups of dies are located on a same surface of the interposer 52, and implement electrical signal interconnection by using the interposer 52.

In an embodiment, structures of the two groups of dies are different. For example, in the two groups of dies shown in FIG. 11, a structure of the group of dies on a left side of the figure is the same as that shown in FIG. 6, and the group of dies on a right side of the figure includes only one die 10. An active surface of the die 10 is connected to the interposer 52 by using the solderballs 52a, and a passive surface of the die 10 is connected to a radiating fin 60 by using a third bonding layer 70.

Alternatively, in another embodiment, structures of the two groups of dies are the same. For example, the two groups of dies both use the structure of the group of dies on the left side of FIG. 11.

It should be noted that, in some embodiments, a structure of at least one group of dies in the two groups of dies in FIG. 11 is replaced with the structure in FIG. 1, FIG. 2, FIG. 9, or FIG. 10. This is not limited in this application.

An embodiment of this application further provides a chip manufacturing method. The manufacturing method includes: providing a die; and forming a first bonding layer between an active surface of the die and the thermal conductive sheet, to connect the active surface of the die to the thermal conductive sheet by using the first bonding layer.

In some examples, the thermal conductive sheet is a monolithic structure, and no conductive pillar is formed in the thermal conductive sheet. In this case, the connecting the active surface of the die to the thermal conductive sheet by using the first bonding layer includes: operation 1, forming an insulated first connection sublayer on the active surface of the die; operation 2, forming an insulated second connection sublayer on a side surface of the thermal conductive sheet; and operation 3, connecting the first connection sublayer to the second connection sublayer through bonding, to obtain the structure shown in FIG. 1.

For example, the first connection sublayer is formed in a manner such as spin-coating, and the second connection sublayer is formed in a manner such as spin-coating.

In some examples, conductive pillars are formed in the thermal conductive sheet. In this case, there are the following three manners of connecting the active surface of the die to the thermal conductive sheet by using the first bonding layer.

In a first manner, through holes are first formed in the thermal conductive sheet 20, and the conductive pillars 21 are formed in the through holes. Then, the first bonding layer is formed between the active surface of the die and the thermal conductive sheet, to connect the thermal conductive sheet 20 with the conductive pillars 21 to the active surface of the die 10 by using the first bonding layer 30. The conductive pillars 21 are formed in the thermal conductive sheet 20 in advance, and then the thermal conductive sheet is connected to the die 10 through bonding. A plurality of operations may be performed synchronously. For example, the die and the thermal conductive sheet are manufactured at the same time, so that efficiency of manufacturing the chip can be increased.

Figure 12:
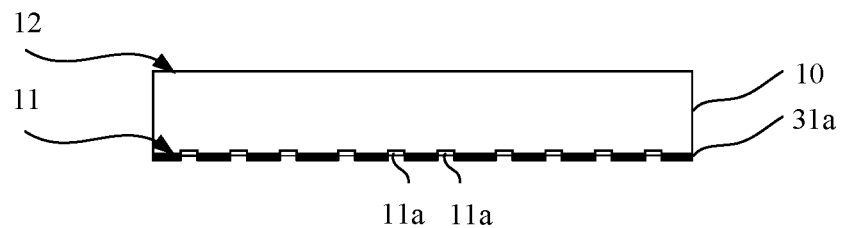
FIG. 12 and FIG. 13 are schematic diagrams of processes of manufacturing a chip according to an embodiment of this application.

In an embodiment, in the first manner, the forming a first bonding layer between an active surface of the die and a thermal conductive sheet includes:

Operation 1: Form an insulated first connection sublayer 31a in a region of the active surface 11 of the die 10 other than pads. As shown in FIG. 12, the first connection sublayer 31a is formed on the active surface 11, and the pads 11a on the active surface 11 are exposed from notches in the first connection sublayer 31a.

Figure 13:
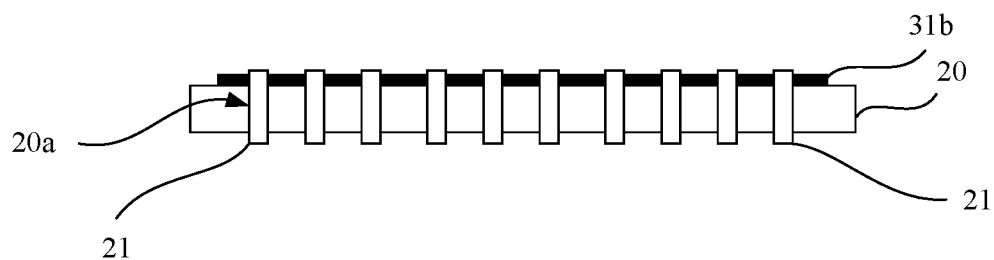

Operation 2: Form an insulated second connection sublayer 31b in a region of a side surface of the thermal conductive sheet 20 other than the conductive pillars 21. As shown in FIG. 13, the plurality of conductive pillars 21 protrude from the side surface of the thermal conductive sheet 20, and the second connection sublayer 31b is located on the thermal conductive sheet 20 and is located in gaps between the conductive pillars 21.

Operation 3: Connect the first connection sublayer 31a to the second connection sublayer 31b through bonding, and connect the pads 11a to the conductive pillars 21 through bonding, to form the first bonding layer 30, so as to connect the active surface 11 of the die 10 to the thermal conductive sheet 20 by using the first bonding layer 30, thereby obtaining the structure shown in FIG. 2. In this case, the first connection sublayer 31a is connected to the second connection sublayer 31b through bonding, to form an insulated connection layer 31. Electrical interconnection structures 32 are formed on bonding interfaces between the pads 11a and the conductive pillars 21.

In some examples, to ensure that the pads 11a can be connected to the conductive pillars 21 through bonding when the first connection sublayer 31a is connected to the second connection sublayer 31b through bonding, the pads 11a protrude from the active surface 11 of the die. In addition, an execution sequence of operation 1 and operation 2 may be exchanged. In an embodiment, operation 2 is performed before operation 1, or operation 1 and operation 2 may be performed at the same time.

The first connection sublayer 31a is made from a compound material or a polymeric material. The compound material includes but is not limited to SiO2, AlN, and SiC. The polymeric material includes but is not limited to BCB, SU-8, and PI. A material of the second connection sublayer 31b is the same as that of the first connection sublayer 31a, to ensure that the first connection sublayer 31a can be connected to the second connection sublayer 31b through bonding.

In an embodiment, the pads 11 a are made from a bonding metal material, for example, Cu, Ag, Au, or Al, or are made from a solder with a low melting point, for example, AgSn, AgCuSn, or CuSn.

In an embodiment, the conductive pillars 21 are made from a metal material, for example, Cu, Ag, or Au. The material of the conductive pillars 21 needs to correspond to that of the pads 11a, to ensure that the pads 11a can be connected to the conductive pillars 21 through bonding.

It should be noted that, in an embodiment, the pads 11a are directly connected to the conductive pillars 21 through bonding, to form the electrical interconnection structures 32. In an embodiment, the method further includes: forming a solder layer on the pads 11a, the conductive pillars 21, or both, so that the pads 11 a are connected to the conductive pillars 21 through bonding by using the solder layer. The electrical interconnection structures each include the solder layer and a structure (the pad or the conductive pillar) opposite to the solder layer.

In a second manner, through holes are first formed in the thermal conductive sheet 20, and then the first bonding layer is formed between the active surface of the die and the thermal conductive sheet, to connect the thermal conductive sheet 20 to the active surface of the die 10 by using the first bonding layer 30, and then conductive pillars 21 are formed in the through holes.

Figure 14:
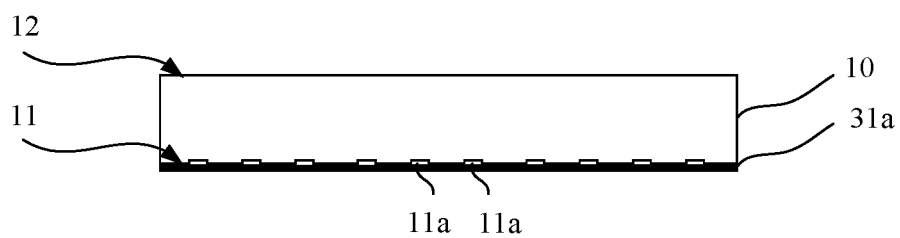
FIG. 14 to FIG. 17 are schematic diagrams of processes of manufacturing another chip according to an embodiment of this application.

In an embodiment, in the second manner, connecting the active surface of the die to the thermal conductive sheet by using the first bonding layer includes:

Operation 1: Form an insulated first connection sublayer 31a on the active surface 11, where the first connection sublayer 31a covers the active surface 11, as shown in FIG. 14.

Figure 15:

Operation 2: Form an insulated second connection sublayer 31b on a side surface of the thermal conductive sheet 20, where the second connection sublayer covers a side surface of the thermal conductive sheet, as shown in FIG. 15.

Figure 16:

Operation 3: Connect the first connection sublayer 31a to the second connection sublayer 31b through bonding, to form an insulated connection layer 31, as shown in FIG. 16.

Figure 17:
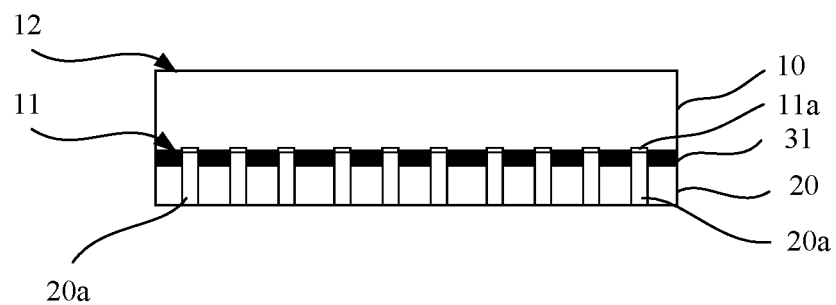

Operation 4: Form, in the thermal conductive sheet 20 and the insulated connection layer 31, through holes 20a corresponding to pads 11a on the active surface 11, where a part in the insulated connection layer 31 other than the through holes 20a is the first bonding layer 30, as shown in FIG. 17.

Operation 5: Form, through deposition on the pads 11a, the conductive pillars 21 located in the through holes 20a, where the conductive pillars 21 run through the thermal conductive sheet 20, to obtain the structure shown in FIG. 2.

It should be noted that, an execution sequence of operation 1 and operation 2 may be exchanged. In an embodiment, operation 2 is performed before operation 1, or operation 1 and operation 2 are performed at the same time.

In a third manner, the thermal conductive sheet 20 is first connected to the active surface of the die 10 by using the first bonding layer 30, then through holes are formed in the thermal conductive sheet 20, and then conductive pillars 21 are formed in the through holes.

Figure 18:
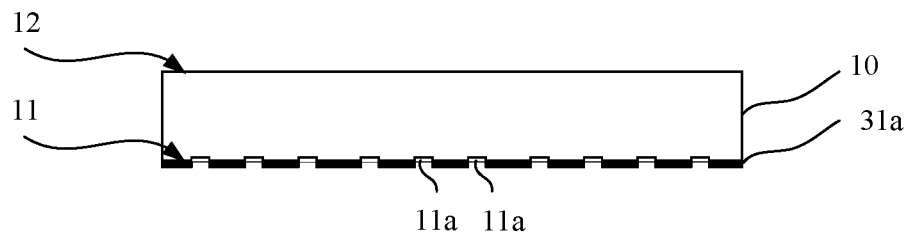
FIG. 18 to FIG. 20 are schematic diagrams of processes of manufacturing another chip according to an embodiment of this application.

In an embodiment, in the third manner, connecting the active surface of the die to the thermal conductive sheet by using the first bonding layer includes:

Operation 1: Form an insulated first connection sublayer 31a in a region of the active surface 11 other than pads 11a, as shown in FIG. 18.

Figure 19:
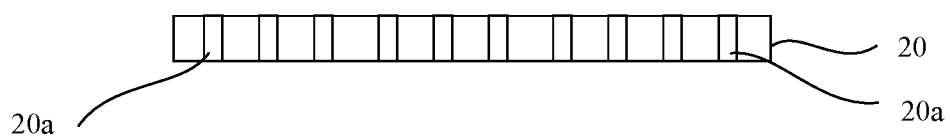

Operation 2: Form a plurality of through holes 20a in the thermal conductive sheet 20, where the through holes 20a correspond to the pads 11a, as shown in FIG. 19.

Figure 20:
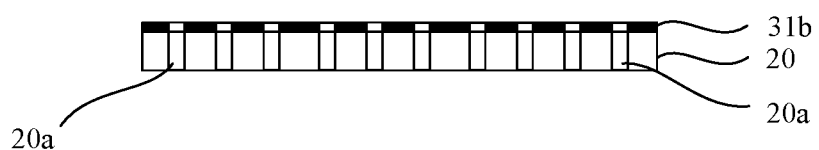

Operation 3: Form an insulated second connection sublayer 31b in a region of a side surface of the thermal conductive sheet 20 other than the through holes 20a, as shown in FIG. 20.

Operation 4: Connect the first connection sublayer 31a to the second connection sublayer 31b through bonding, to form the first bonding layer 31, as shown in FIG. 17.

Operation 5: Form, through deposition on the pads 11a, the conductive pillars 21 located in the through holes 20a, where the conductive pillars 21 run through the thermal conductive sheet 20, to obtain the structure shown in FIG. 2.

It should be noted that, an execution sequence of operation 1, operation 2, and operation 3 is not limited in this application. For example, operation 2 and operation 3 are performed before operation 1, or operation 1 and operation 2 are performed at the same time, and then operation 3 is performed; or operation 2 is performed first, and then operation 1 and operation 3 are performed at the same time.

In some examples, in the three manners, the through holes are formed in the thermal conductive sheet 20 in the following manner: forming a photoresist layer on a side surface of the thermal conductive sheet; exposing and developing the photoresist layer to obtain a patterned photoresist layer, where locations at the patterned photoresist layer that correspond to the through holes are hollowed out; etching the thermal conductive sheet by using the patterned photoresist layer as a mask, to form the through holes in the thermal conductive sheet. In some other examples, the through holes are formed in the thermal conductive sheet 20 through laser drilling.

In an embodiment, in the three manners, the conductive pillars 21 are formed in the through holes 20a in manners such as electroplating and sintering. It should be noted that, in the second and third manners, the conductive pillars 21 are directly deposited on the pads 11a, for example, directly formed on the pads 11a in a manner such as electroplating. In other words, the conductive pillars 21 extend into the first bonding layer 30 to be connected to the pads 11a.

In an embodiment, for any one of the foregoing three-dimensional stacked chips, the manufacturing method further includes: connecting a passive surface of the die to another thermal conductive sheet by using a second bonding layer, where a structure of the second bonding layer is the same as that of the first bonding layer, and two dies connected to two sides of the thermal conductive sheet are electrically connected to each other by using the conductive pillars in the thermal conductive sheet.

For a process of connecting the passive surface of the die to the adjacent thermal conductive sheet by using the second bonding layer, refer to the process of connecting the active surface of the die to the thermal conductive sheet by using the first bonding layer. Detailed description is omitted herein.

In an embodiment, the manufacturing method further includes: connecting, to a radiating fin by using a third bonding layer, the passive surface of the outermost die in the die and the thermal conductive sheet that are connected together. For example, a first bonding sublayer is first formed on the passive surface of the outermost die, then a second bonding sublayer is formed on the radiating fin, and then the first bonding sublayer is connected to the second bonding sublayer through bonding.

Materials of the first bonding sublayer and the second bonding sublayer correspond to the material of the foregoing third bonding layer, and detailed description is omitted herein.

In an embodiment, the radiating fin is manufactured in any one of the following manners: HTHP, MWCVD, DC arc CVD, and PVD.

In some examples, manners of bonding between the radiating fin and the passive surface of the die include but are not limited to: eutectic bonding, ADB, thermal compression bonding, and surface activated bonding SAB.

In an embodiment, the manufacturing method further includes: connecting, to a circuit board, the die and the thermal conductive sheet that are connected together.

In an embodiment, the circuit board is a substrate, and the connecting, to a circuit board, the die and the thermal conductive sheet that are connected together includes: first placing, on the substrate, the die and the thermal conductive sheet that are connected together, and then connecting, to the substrate by using solderballs, the die and the thermal conductive sheet that are connected together.

In an embodiment, the circuit board includes a substrate and an interposer. The interposer is located on the substrate. The connecting, to a circuit board, the die and the thermal conductive sheet that are connected together includes: connecting, to a side surface of the interposer by using solderballs, the die and the thermal conductive sheet that are connected together, and connecting the other side surface of the interposer to the substrate by using solderballs.

An embodiment of this application further provides an electronic device, including any one of the foregoing chips.

For example, the electronic device is a mobile terminal, including but not limited to a mobile phone, a tablet computer, or a notebook computer.

Unless otherwise defined, a technical term or a scientific term used herein should have a general meaning understood by one of ordinary skilled in the art of this disclosure. In the specification and claims of the patent application of this disclosure, the terms "first", "second", and the like are not intended to indicate any order, quantity or significance, but are intended to distinguish between different components. Likewise, "a/an", "one", or the like is not intended to indicate a quantity limitation either, but is intended to indicate existing at least one. Similar words such as "include" or "comprise" mean that elements or articles preceding "include" or "comprise" cover elements or articles enumerated after "include" or "comprise" and their equivalents, and do not exclude other elements or articles. "Connection", "link" or the like is not limited to a physical or mechanical connection, but may include an electrical connection, whether directly or indirectly. "Up", "down", "left", "right", "top", "bottom", and the like are only used to indicate a relative location relationship, and when an absolute location of a described object changes, the relative location relationship may also change accordingly.

The foregoing descriptions are merely specific embodiments of this application, but are not intended to limit this application. Any modification, equivalent replacement, or improvement made without departing from the spirit and principle of this application should fall within the protection scope of this application.

What is claimed is:

1. A chip, comprising:
a die; and
a thermal conductive sheet, wherein an active surface of the die is connected to the thermal conductive sheet by using a first bonding layer, wherein thermal resistance of the first bonding layer is less than a threshold, and wherein the thermal conductive sheet comprises one or more of a single crystal diamond film, a polycrystalline diamond film, a boron nitride film, or a boron arsenide film.

2. The chip according to claim 1, further comprising:
a plurality of conductive pillars run through the thermal conductive sheet,
wherein the first bonding layer comprises an insulated connection layer and a plurality of electrical interconnection structures, wherein the electrical interconnection structures are located in the insulated connection layer; and
a plurality of pads of the active surface connected to the conductive pillars through bonding by using the electrical interconnection structures, wherein a region of the active surface other than the pads is connected to the thermal conductive sheet through bonding by using the insulated connection layer.

3. The chip according to claim 1, further comprising:
a plurality of conductive pillars run through the thermal conductive sheet; and
wherein the first bonding layer comprises an insulated connection layer, wherein the conductive pillars are deposited on pads of the active surface, and wherein a region of the active surface other than the pads is connected to the thermal conductive sheet through bonding by using the insulated connection layer.

4. The chip according to claim 2, wherein the electrical interconnection structures are made from one or more of: Cu, Ni, W, CuSn, or AuSn.

5. The chip according to claim 2, wherein the insulated connection layer is made from one or more of: SiO2, AlN, SiC, benzocyclobutene, polyimide, or near ultraviolet negative photoresist.

6. The chip according to claim 2, wherein the thermal resistance of the first bonding layer is less than the threshold including 1 Kmm$^2$/W.

7. The chip according to claim 1, further comprising at least two dies and at least one thermal conductive sheet, and wherein the dies and the thermal conductive sheet are stacked alternately.

8. The chip according to claim 7, wherein the thermal conductive sheet is connected to a passive surface of an adjacent die by using a second bonding layer, and wherein a structure of the second bonding layer is the same as that of the first bonding layer.

9. The chip according to claim 1, wherein the chip comprises a seed layer located between the conductive pillars and the thermal conductive sheet.

10. The chip according to claim 1, further comprising:
a circuit board, wherein the die and the thermal conductive sheet are located on the circuit board, and wherein in an arrangement direction of the die and the thermal conductive sheet, the thermal conductive sheet is adjacent to the circuit board.

11. The chip according to claim 1, further comprising:
a radiating fin connected to a passive surface of an outermost die by using a third bonding layer.

12. The chip according to claim 11, wherein the third bonding layer is made from a metal material, and the metal material comprises one or more of: Au, AuSn, Cu, CuSn, Ag, or AgSn; or
the third bonding layer is made from a nonmetallic material, and the nonmetallic material comprises one or more of: SiO2, SiC, AlN, or Si.

13. The chip according to claim 1, wherein a projection of the die on a surface of the connected thermal conductive sheet is located within the surface or overlaps the surface.

14. The chip according to claim 1, wherein a thickness of the die is 15 µm to 500 µm.

15. The chip according to claim 1, wherein a thickness of the thermal conductive sheet is 50 µm to 500 µm.

16. An electronic device, comprising:
a chip having a die and a thermal conductive sheet, wherein an active surface of the die is connected to the thermal conductive sheet by using a first bonding layer, wherein thermal resistance of the first bonding layer is less than a threshold, and wherein the thermal conductive sheet comprises one or more of a single crystal diamond film, a polycrystalline diamond film, a boron nitride film, or a boron arsenide film.

17. The electronic device according to claim 16, wherein the chip further comprises:
a plurality of conductive pillars run through the thermal conductive sheet,
wherein the first bonding layer comprises an insulated connection layer and a plurality of electrical interconnection structures located in the insulated connection layer; and
a plurality of pads of the active surface are connected to the conductive pillars through bonding by using the electrical interconnection structures, wherein a region of the active surface other than the pads is connected to the thermal conductive sheet through bonding by using the insulated connection layer.

18. The electronic device according to claim 16, wherein the chip further comprises:
a plurality of conductive pillars run through the thermal conductive sheet; and
wherein the first bonding layer comprises an insulated connection layer, wherein the conductive pillars are deposited on pads of the active surface, and wherein a region of the active surface other than the pads is connected to the thermal conductive sheet through bonding by using the insulated connection layer.

19. The electronic device according to claim 17, wherein the electrical interconnection structures are made from one or more of: Cu, Ni, W, CuSn, or AuSn.

* * * * *